United States Patent [19]

Hamburgen et al.

[11] Patent Number: 5,240,549
[45] Date of Patent: Aug. 31, 1993

[54] FIXTURE AND METHOD FOR ATTACHING COMPONENTS

[75] Inventors: William Hamburgen, Menlo Park; John S. Fitch, Newark, both of Calif.

[73] Assignee: Digital Equipment Corporation, Maynard, Mass.

[21] Appl. No.: 722,972

[22] Filed: Jun. 28, 1991

[51] Int. Cl.[5] .......................... B30B 7/02; B30B 15/34
[52] U.S. Cl. ............................ 156/583.91; 100/93 P; 100/237; 100/266; 156/312; 156/382
[58] Field of Search ............. 156/583.1, 583.3, 583.91, 156/580, 323, 312, 295; 100/237, 266, 93 P

[56] References Cited

U.S. PATENT DOCUMENTS

| | | | |
|---|---|---|---|
| 2,746,514 | 5/1956 | Warnken | 156/581 |
| 3,067,309 | 12/1962 | Chinn | 100/237 |
| 3,669,333 | 6/1972 | Coucoules | 156/323 |
| 4,161,569 | 6/1979 | Faber | 429/234 |
| 4,648,934 | 3/1987 | Kiss | 156/323 |
| 4,900,390 | 2/1990 | Colton | 156/295 |
| 4,968,376 | 11/1990 | Shimada | 156/580 |
| 5,076,880 | 12/1991 | Spengler | 100/237 |
| 5,106,451 | 4/1992 | Kan | 156/583.3 |

Primary Examiner—Michael W. Ball
Assistant Examiner—Daniel J. Stemmer
Attorney, Agent, or Firm—Flehr, Hohbach, Test, Albritton & Herbert

[57] ABSTRACT

A fixture (10) for bonding multiple components together includes a bottom plate (20), a middle plate (22) and a top plate (24). The plates (20), (22) and (24) are aligned by dowels (26) and clamps (30). Bottom plate (20) has a rectangular pocket (32) for holding heat sink (14) and alignment pins (34) for locating plastic pin grid array (PPGA) package (12) over the heat sink (14). An annular projection (40) covered with a conformal pad (42) extends from bottom surface (44) of the middle plate (22). Dowel (50) extends through openings (46) and (36) in the top and middle plates (24) and (22) to apply pressure to chip (16). A first spring (56) is mounted on the dowel (50) and compressed between the top plate (24) and a snap ring (58) to provide pressure from the dowel (50) on the chip (16). A second, larger diameter spring (60) is compressed between the middle plate (22) and the top plate (24) to provide pressure from the middle plate (22) on the PPGA (12). Cartridge heaters (62) are embedded in the bottom plate (20) to provide heat for epoxy or solder bonding. A thermocouple (64) monitors temperature at the bottom plate (20).

9 Claims, 3 Drawing Sheets

FIXTURE AND METHOD FOR ATTACHING COMPONENTS

BACKGROUND OF THE INVENTION

1. Field of the Invention

The present invention relates generally to a fixture and method for attaching multiple components together at one time. More particularly, it relates to such a fixture and method which simplifies and improves the assembly of electronic components. Most especially, the invention relates to such a fixture and method which reduces the amount of time that parts of the electronic component assembly are exposed to high temperatures needed for epoxy cure or solder reflow by combining several assembly steps which would normally occur sequentially into one step. The invention further relates to a method which will allow two parts to be bonded together at a low clamping pressure to generate thinner joints. This method is usable separately or in combination with the fixture and method for attaching many components together at one time.

It is often desirable to have very thin adhesive joints between two parts. As an example, the joint between an integrated circuit chip and a heat sink offers the best heat transfer when the joint is very thin.

2. Description of the Prior Art

Electronic parts are assembled conventionally in the following manner: A package is first attached to a substrate, slug or heat sink surface, referred to hereafter for convenience as a heat sink. After that, an integrated circuit chip is attached to the heat sink. Both operations involve high temperatures and significant assembly time.

A similar approach is used to manufacture a multi chip unit (MCU) for the VAX 9000 computer system. For the MCU, several chips are bonded onto a common surface at one time. No other parts are bonded at this time, nor are more mating parts bonded at the same time.

When two flat surfaces are squeezed together with a flowing adhesive between them, the pressure that builds up in the adhesive is highest in the center. Joints of very large area have very large pressure gradients in them because the adhesive must flow a long distance when it is squeezed. Therefore, large area joints are usually thicker than small area joints. To make bonds thin, conventional techniques require high normal pressures to squeeze the joint together.

Escape paths are used in the manufacture of wooden parts, where the glue that forms a joint travels through a small channel. A wooden dowel that is pressed into a hole filled with glue will often have grooves running along its axis to allow glue to escape.

Some epoxy films are made with a support matrix of fiberglass that, by the nature of its shape, forms indentations, but not perforations. Manufacturers usually make an effort to reduce these indentations.

A need therefore exists for improvement in component attachment fixtures and methods, and in methods for producing thin adhesive joints.

SUMMARY OF THE INVENTION

A fixture for attaching multiple components together at one time in accordance with this invention has a base member configured to hold the components in position for assembly with an adhesive material that becomes fluid with application of heat between the components. A first means applies pressure to urge a first pair of the components together. A second means applies pressure, independent of the pressure of the first means, to urge a second pair of the components together. A means heats the components to a sufficient temperature to make the adhesive material fluid while pressure is applied from the first and second means for applying pressure.

A method for attaching multiple components together at one time in accordance with this invention includes positioning the components for assembly with an adhesive material that becomes fluid with application of heat between the components. A first pressure is applied to urge a first pair of the components together. A second pressure, independent of the first pressure, is applied to urge a second pair of the components together. The components are heated to a sufficient temperature to make the adhesive material fluid while the first and second pressures are applied.

A structure for bonding a first component to a second component includes a layer of adhesive material which becomes fluid when heated positioned between the first component and the second component. Cavities are positioned adjacent to the adhesive material to receive a portion of the fluid adhesive material.

A method for producing thin adhesive joints in accordance with this invention includes providing a layer of adhesive material which becomes fluid when heated between a first component and a second component. Cavities are positioned adjacent to the adhesive material to receive a portion of the fluid adhesive material. Pressure is applied between the first and second components. The layer of adhesive material is heated until it becomes fluid. The portion of the fluid adhesive material is allowed to flow into the regions.

The attainment of the foregoing and related advantages and features of the invention should be more readily apparent to those skilled in the art, after review of the following more detailed description of the invention, taken together with the drawings, in which:

DETAILED DESCRIPTION OF THE INVENTION

Figure 1:
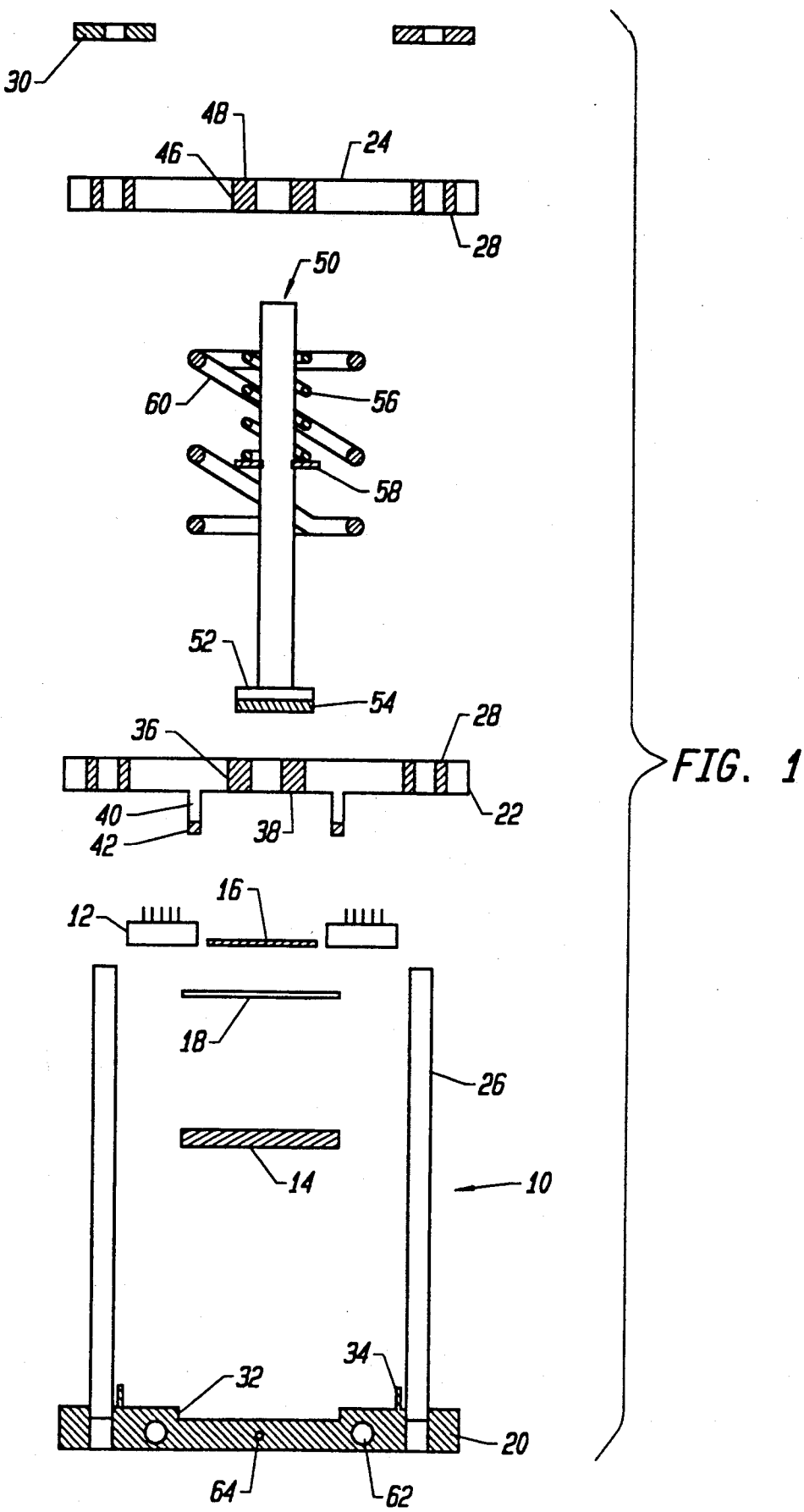
FIG. 1 is an exploded side view of a fixture for attaching multiple components together at one time in accordance with the invention.
Figure 2:
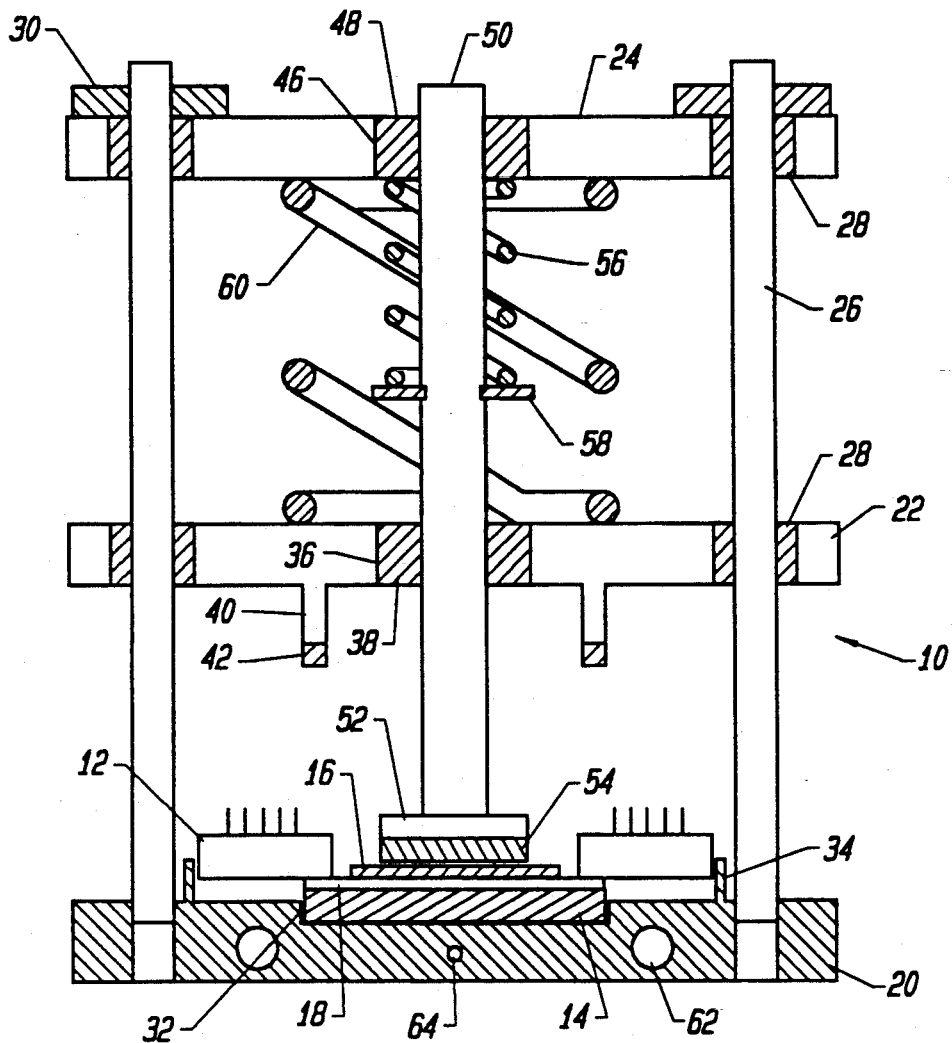
FIG. 2 is a cross section view of the fixture in FIG. 1 in use.

Turning now to the drawings, more particularly to FIGS. 1 and 2, there is shown a fixture 10 for attaching multiple components together. The electronic components to be attached together with the fixture 10 include, by way of example, a plastic pin grid array (PPGA) 12 to be fastened to a metal heat sink 14, and an integrated circuit chip 16 to be fastened to the heat sink 14. Adhesive layer 18, which is either solder or epoxy, is used for this purpose. While the same material is used for fastening both the PPGA 12 and the chip 16 to the heat sink 14, separate control over pressure applied to the PPGA 12 and the chip 16 during the formation of their bonds to the heat sink 14 is required because of the different nature of the components and their area of contact with the heat sink 14.

The fixture 10 includes a bottom plate 20, a middle plate 22 and a top plate 24. The plates, 20, 22 and 24 are aligned by dowels 26. The dowels 26 are fixedly attached to the bottom plate 20 and pass through dowel bushings 28 in the middle and top plates 22 and 24. Clamps 30 tightened on the dowels 26 hold the top plate 24 in place. Bottom plate 20 has a rectangular pocket 32 for holding the heat sink 14 and alignment pins 34 for locating the PPGA 12 over the heat sink 14. The middle plate 22 has a centrally disposed opening 36 over the pocket 32 on the bottom plate 20, with a dowel bushing 38 in the opening 36. An annular projection 40 covered with a conformal pad 42 extends from bottom surface 44 of the middle plate 22. The top plate 24 also has a centrally disposed opening 46 containing a dowel bushing 48 over the opening 36.

Dowel 50 extends through the openings 46 and 36 to apply pressure to the chip 16. End 52 of the dowel 50 has a conformal pad 54 for engaging the chip 16. A first spring 56 is mounted on the dowel 50 and compressed between the top plate 24 and a snap ring 58 to provide pressure from the dowel 50 on the chip 16. A second, larger diameter spring 60 is compressed between the middle plate 22 and the top plate 24 to provide pressure from the middle plate 22 on the PPGA 12.

Cartridge heaters 62 are embedded in the bottom plate 20 to provide heat for the epoxy or solder bonding. A thermocouple 64 monitors temperature at the bottom plate 20.

In use of the fixture 10, the epoxy or solder is applied to the surface of the heat sink 14. Various methods of application may be used, such as solder paste screening, solder preforms, solder dipping or coating, epoxy paste screening, paste dispensing and epoxy film preforms. The heat sink 14 is placed in the locating pocket 32 of the bottom plate 20. The PPGA package 12 is placed over the heat sink 14, and is precisely located by the locating pins 34. The integrated circuit chip 16 is placed on the heat sink 14 and is precisely located by features on the package 12 or on the fixture 10 (not shown). Other components, such as capacitors, are placed in position.

Pressure is applied to the various components by the top plate 24 of the fixture 10 when/as it is slid down the dowels 26. The dowel 50, driven by spring 56, applies pressure to the chip 16. The middle plate 22, driven by the spring 60, applies pressure to the PPGA package 12. Other parts of the fixture 10 (not shown), each having their own spring mechanism, may apply pressure to other components, such as capacitors. The pressure squeezes the parts into the soft epoxy or reflowing solder. Various spring types or snap ring locations can be used to adjust the pressures provided by the fixture 10 on different components being assembled using the fixture.

The fixture 10 and parts are now placed in the desired environment for curing. That environment may be atmospheric, nitrogen, vacuum, or the like. With the fixture assembled, the cartridge heaters 62 heat the assembly up to a desired temperature. The thermocouple 64 is monitored by a temperature controller (not shown), which supplies power to the cartridge heaters 62. After the required time at the required temperature, the parts and fixture 10 are cooled down, and the assembly is finished.

Figure 3:
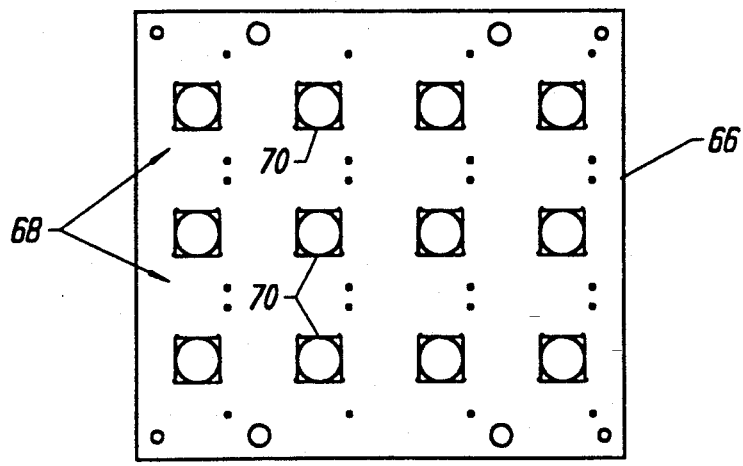
FIG. 3 is a plan view of a portion of a second embodiment of a fixture in accordance with the invention.

FIG. 3 shows a bottom plate 66 for a fixture similar to that of FIGS. 1-2, but having an array 68 of pockets 70 for receiving heat sinks, so that twelve of the packages as shown in FIG. 2 can be assembled at once. The middle plate and top plate for this fixture have corresponding arrays of the other elements of the fixture. Other than as shown and described, the construction and operation of a fixture incorporating the bottom plate 66 is the same as in the FIGS. 1-2 embodiment.

Figure 4:
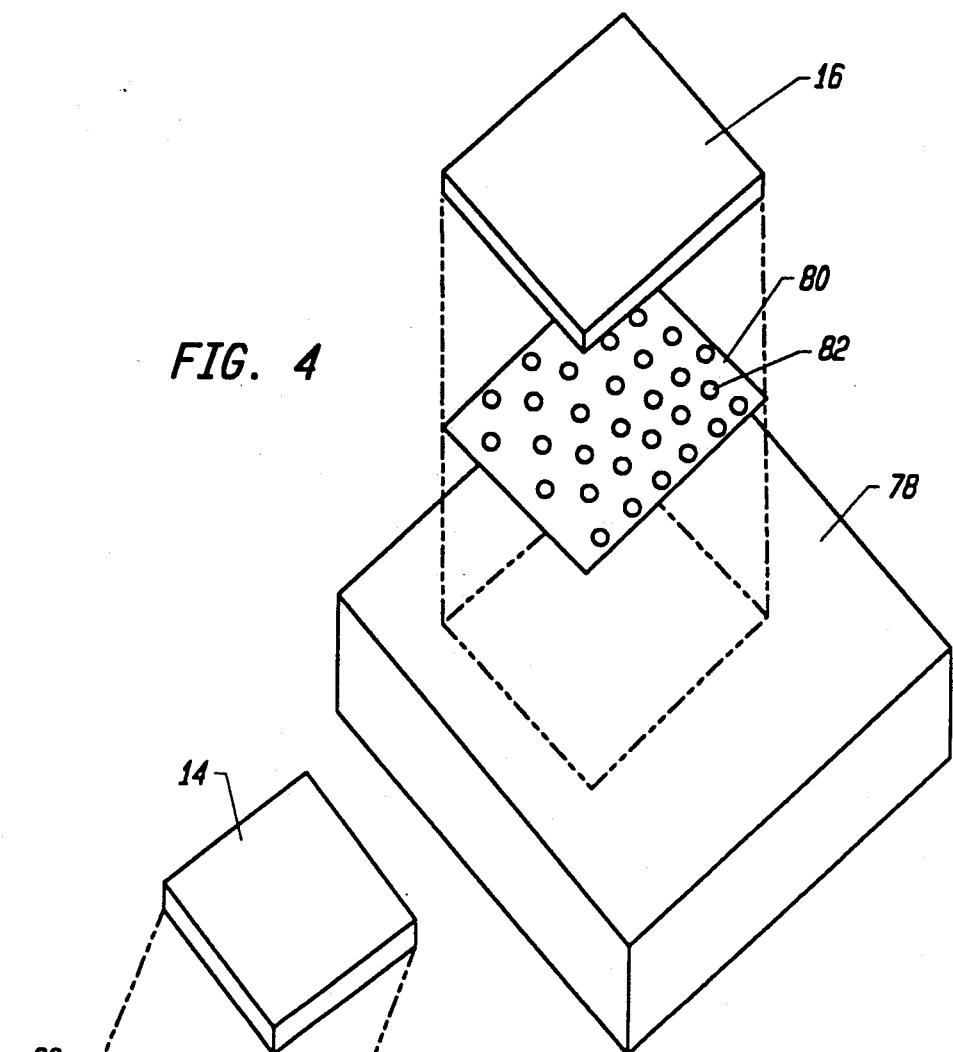
FIG. 4 is a perspective view of a first assembly during practice of a first embodiment of a process for forming thin joints in accordance with the invention.

FIG. 4 shows an integrated circuit chip 16, heat sink 78 and perforated epoxy, thermoplastic sheet or solder preform 80, which is preferably used with a fixture comparable to the fixture 10 to provide thinner joints in the assembly. The preform 80 is punched, drilled or cut to provide perforations 82. The preform is then placed between the chip 16 and the heat sink 78 in an evacuated chamber, so that air is not trapped in the voids defined by the perforations 82 and the flowing adhesive can move into the void areas. As the parts are squeezed together in the fixture, the temperature of the assembly is increased to make the adhesive fluid. Since the pressure provided by the fixture causes the adhesive to flow, it flows in the path of least resistance, in this case, to the voids defined by the perforations 82. Releasing the vacuum prior to solidification will further collapse the voids. A pattern of circular perforations arranged at corners of equilateral triangles, with the perforations being almost tangent to one another, represents proportionally the most area as perforations, up to about 22.5% of the surface area of the preform.

Figure 5:
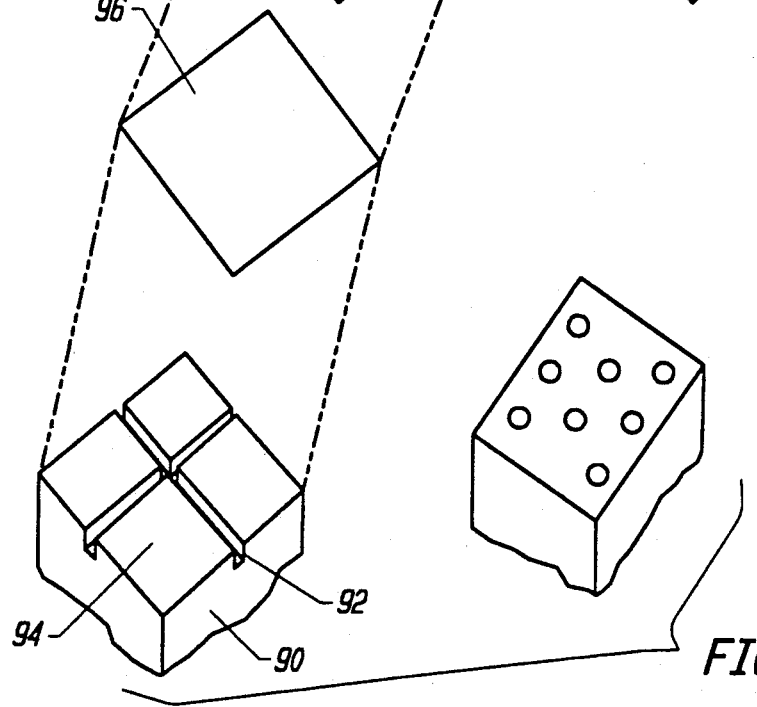
FIG. 5 is a perspective view similar to FIG. 4, but of a second assembly during practice of a second embodiment of a process for forming thin joints in accordance with the invention.

FIG. 5 shows another embodiment of the method for producing thin joints, in which heat sink 90 has grooves 92 in its upper surface 94. A layer 96 of an adhesive material, such as epoxy paste, thermoplastic preform or solder is provided over the upper surface 94 of the heat sink 90. When integrated circuit chip 14 is pressed down on the layer 96 and the assembly is heated, the pressure causes some of the resulting liquid adhesive to enter the grooves 92, thus producing a thinner adhesive layer in the finished assembly. Instead of grooves, an array of wells in the upper surface of the heat sink could be used. The pressure and heat can be applied in an evacuated chamber as in the FIG. 4 embodiment to avoid trapped air in the grooves or wells. As in the FIG. 4 embodiment, a fixture as shown in FIGS. 1-3 is desirably used to hold the parts of the assembly, to apply the pressure, and to provide the heat.

By providing voids or spaces into which liquid adhesive will flow when pressure is applied, the amount of pressure required to produce a joint of a given thickness is reduced. This is a substantial benefit for delicate parts, such as used in electronic assemblies. Correspondingly, for a given amount of pressure, a thinner joint is produced. This is advantageous in any application where improved heat transfer is required between two parts joined together with an adhesive.

The fixture and process of this invention allows assembly of such heat sensitive parts as electronic components with processes requiring elevated temperatures in a shorter time at high temperature. This is a significant advantage, particularly when the elevated temperature processing is carried out in the absence of air, specifically oxygen, as in a vacuum or nitrogen environment. This fixture and process saves the cost of ovens, reduces damage to the parts, such as intermetallic growth or material creep, and is faster than conventional processing.

It should be apparent to those skilled in the art that various changes in form and details of the invention as shown and described may be made. It is intended that such changes be included within the spirit and scope of the claims appended hereto.

What is claimed is:

1. A fixture for bonding multiple electronic package components of multiple types together at one time, which comprises a base member and a middle member configured to hold the multiple electronic package components of multiple types in position for simultaneous assembly with an adhesive material that becomes fluid with application of heat among the multiple electronic package components of multiple types, a top member positioned over said middle member, first means including a first spring between said top member and a movable connecting member passing through said middle member for applying pressure to urge a first pair of the multiple electronic package components of multiple types together, second means including a second spring between said middle member and said top member for applying pressure, independent of the first means for applying pressure, to urge a second pair of the multiple electronic package components of multiple types together, and means for simultaneously heating the multiple electronic package components of multiple types to a sufficient temperature to make the adhesive material fluid while pressure is applied from said first and second means for applying pressure.

2. The fixture for bonding multiple electronic package components of multiple types together at one time of claim 1 in combination with the multiple electronic package components of the multiple types in which a component of the first pair of the components is also a component of the second pair of the components.

3. The combination of claim 2 in which the component of the first and second pair of components is a heat sink.

4. The fixture for bonding multiple electronic package components of multiple types together at one time of claim 1 in which said means for heating the components comprises at least one cartridge heater embedded in said base member.

5. The fixture for bonding multiple electronic package components of multiple types together at one time of claim 1 additionally comprising means for monitoring temperature produced by said means for heating the components.

6. The fixture for bonding multiple electronic package components of multiple types together at one time of claim 1 in combination with said first and second pairs of the components, at least one layer of the adhesive material, and a plurality of cavities positioned adjacent to the adhesive material to receive a portion of the fluid adhesive material.

7. The combination of claim 6, with at least one of said first and second pairs of components having the adhesive material formed in a layer having perforations defining said plurality of cavities between the at least one of said first and second pairs of components.

8. The combination of claim 6, with at least one of said first and second pairs of components having a surface facing the adhesive material having a plurality of indentations comprising said plurality of cavities.

9. The fixture for bonding multiple electronic package components of multiple types together at one time and component combination of claim 8 in which said plurality of indentations comprise grooves.

* * * * *